(12) United States Patent
Trautmann et al.

(10) Patent No.: US 8,164,381 B2
(45) Date of Patent: Apr. 24, 2012

(54) OPEN-LOOP LINE DRIVER CONTROL METHOD AND APPARATUS

(75) Inventors: Steffen Trautmann, Villach (AT); Alexander Kahl, Landskron (AT)

(73) Assignee: Lantiq Deutschland GmbH, Munich (DE)

( * ) Notice: Subject to any disclaimer, the term of this patent is extended or adjusted under 35 U.S.C. 154(b) by 170 days.

(21) Appl. No.: 12/499,133

(22) Filed: Jul. 8, 2009

(65) Prior Publication Data
US 2011/0006822 A1 Jan. 13, 2011

(51) Int. Cl.
*H03F 3/38* (2006.01)
*H03G 3/20* (2006.01)

(52) U.S. Cl. .......................... 330/10; 330/136
(58) Field of Classification Search .................... 330/10, 330/136; 455/127.1
See application file for complete search history.

(56) References Cited

U.S. PATENT DOCUMENTS

| | | | |
|---|---|---|---|
| 4,873,493 A | 10/1989 | Fujiwara | |
| 6,141,541 A | 10/2000 | Midya et al. | |
| 6,987,851 B1 | 1/2006 | Toumani et al. | |
| 7,031,457 B2 | 4/2006 | Melsa | |
| 7,696,818 B2 * | 4/2010 | Kunihiro et al. | 330/136 |
| 2002/0191705 A1 | 12/2002 | Melsa et al. | |
| 2004/0001586 A1 | 1/2004 | Melsa et al. | |
| 2004/0185803 A1 | 9/2004 | Tanabe et al. | |
| 2009/0160548 A1 * | 6/2009 | Ishikawa et al. | 330/127 |

FOREIGN PATENT DOCUMENTS

| | | |
|---|---|---|
| EP | 2073380 A2 | 6/2009 |
| GB | 2332996 A | 7/1999 |
| WO | 0205418 A2 | 1/2002 |

OTHER PUBLICATIONS

Rogers, "Understanding Buck-Boost Power Stages in Switchmode Power Supplies: Application Report," Mar. 1999, pp. i-iv and 1-28, Texas Instruments Incorporated.
International Search Report mailed Jan. 24, 2011 in re International Application No. PCT/EP2010/004178.

* cited by examiner

*Primary Examiner* — Robert Pascal
*Assistant Examiner* — Khiem Nguyen
(74) *Attorney, Agent, or Firm* — Murphy, Bilak & Homiller, PLLC

(57) ABSTRACT

According to an embodiment, a circuit includes an amplifier and an open-loop control system. The amplifier has an output stage for amplifying a signal, a power supply for driving a supply voltage of the output stage to different voltage levels responsive to being modulated and a pulse width modulator for modulating the power supply responsive to a mask input. The open-loop control system includes a mask generator and a detector. The mask generator is configured to generate the mask input as a function of the envelope of the signal. The detector is configured to detect discontinuities in the mask input and compensate for the discontinuities.

24 Claims, 7 Drawing Sheets

OPEN-LOOP LINE DRIVER CONTROL METHOD AND APPARATUS

BACKGROUND

Certain communication technologies such as xDSL have a high peak-to-average power ratio (PAR) which is the ratio of the peak signal power to the average power of the signal, where "x" specifies a particular variant of DSL (digital subscriber line). The term xDSL refers to DSL technologies such as ADSL (asymmetric DSL), HDSL (high bit rate DSL), IDSL (ISDN DSL), SDSL (symmetric DSL), VDSL (very high speed DSL), etc. These and other types of xDSL systems are generically referred to herein as "DSL" systems. A high PAR requirement places severe constraints on the line driver circuitry of DSL equipment. The line driver is typically used to amplify a signal and drive the amplified signal onto a line. Many types of conventional line driver circuits include class-A or class-AB amplifiers. However, class-A and -AB amplifiers are not well suited for high PAR applications such as DSL because theses classes of amplifiers remain fully powered even when not transmitting at peak power, thereby wasting significant energy.

Class-H amplifiers can be used in DSL equipment to reduce power consumption. A class-H amplifier can be constructed by adjusting the supply voltage of a conventional class-AB amplifier using a dynamic DC-DC converter in response to amplitude fluctuations in the signal to be transmitted. The power draw of a class-H amplifier is ideally reduced by the crest factor of the signal, where the crest factor is the square root of the PAR. Using a class-H amplifier as a line driver for high PAR applications potentially yields substantial power savings, especially for DSL technologies having a very high crest factor. In a practical realization, although the gain is reduced by necessary tolerance ranges in the voltage tracking, it is possible in principle to reduce the power consumption to 50% to 70% relative to a conventional class-AB amplifier.

In conventional systems, the output voltage of the DC-DC converter coupled to a class-H amplifier is typically set by means of a pulse width modulator (PWM). The duty cycle of the PWM determines the level of supply voltage applied to the class-H amplifier. The duty cycle of the PWM is a function of a mask input to the PWM. The profile of the mask depends on the envelope of the input signal of the amplifier. Since the output voltage of the DC-DC converter cannot follow the signal profile at every desired speed, the amplifier supply voltage, as early as before the occurrence of a signal peak, must be ramped up from a specific base level to the corresponding peak voltage in a controlled manner with a finite edge. Otherwise, the signal being amplified will be distorted. In addition, after the occurrence of the signal peak, the amplifier supply voltage should be ramped down back to the base level or some other suitable voltage level to save power. The profile of mask input to the PWM should thus correspond to changes in the signal being amplified so that the amplifier supply voltage can be properly ramped up and down to prevent clipping of the output signal while maximizing efficiency.

The DC-DC converter that generates the amplifier supply voltage has two operating modes: a continuous mode and a discontinuous mode. In the continuous mode, a current always flows through a coil inductor of the converter during the entire switching cycle, and the ratio of output voltage to input voltage of the DC-DC converter depends to a first approximation on only the duty ratio D of the PWM as given by:

$$V_{out} = -V_{in} \cdot \frac{D}{1-D} \quad (1)$$

If the load current falls below a certain limit value, the coil current decreases to zero during certain portions of the switching cycle. In this so-called discontinuous mode, the output voltage is no longer dependent only on the duty ratio of the PWM, but it is also dependent on the inductance L of the coil, the PWM frequency 1/Ts and the load resistance R of the class-H stage as given by:

$$V_{out} = -V_{in} \cdot \frac{D}{\sqrt{K}} \quad (2)$$

where, $$K = \frac{2 \cdot L}{R \cdot T_s} \quad (3)$$

The mask input to the PWM can be described as a superposition of temporally offset and scaled ramp functions and can be generated in various ways. Upon each change from a flat level to a rising or falling edge, from a rising edge to a falling edge, or vice versa, a discontinuity point forms in the profile of the mask. Each discontinuity causes the DC-DC converter to affect a transient oscillation in accordance with its ramp response. Moreover, the DC-DC converter is ideally supplied with an uncontrolled input voltage in order to avoid an additional loss of efficiency as a result of a further DC-DC conversion. Ultimately, operation in the discontinuous mode is greatly dependent on the tolerance of the coil inductance L of the DC-DC converter. For these reasons, typically a closed-loop controller feeds back the output of the DC-DC converter to control the input of the PWM. The closed-loop controller compares the output voltage of the DC-DC converter with the value of the mask and correspondingly adapts the mask input to the PWM so that the output voltage of the converter follows the mask within acceptable tolerances.

Implementing a class-H amplifier by means of a closed-loop control system has several disadvantages. For example, the closed-loop control system requires feedback. Since the specific application involves the implementation of closed-loop control and PWM generation in the data pump portion of the line card, a further line is needed per channel for returning the output voltage or an equivalent measurement signal as a feedback signal. These extra feedback lines are in addition to the line required to communicate the PWM signal to the line driver. All of these additional lines significantly increase the routing outlay on the line card. Also, the closed-loop controller requires additional circuitry outlay in the data pump. For example, converting the amplifier voltage into a usable digital feedback signal requires additional A/D circuitry in the data pump or conversion into an additional PWM signal in the line driver. Also, a counter is typically needed in the data pump to evaluate the duty ratio. Each of these extra circuits requires additional outlay.

The closed-loop controller for a class-H amplifier also never exactly hits a predetermined target value. Particularly in the case of flat voltage levels, it should be expected that periodic control patterns will be established since the controller jitters about the target value. These control patterns are also superimposed on the supply voltage and forwarded to the signal output of the line driver in a manner attenuated by the power supply rejection ratio (PSRR). This causes disturbance frequencies in the signal being amplified which are difficult to predict and may lie in the useful band. In order to reduce these disturbance frequencies to a minimum, a comparatively high resolution of the PWM duty ratio is required. This necessitates a counter having a very high clock rate, making the implementation of the closed-loop controller even more difficult.

SUMMARY

According to an embodiment, a circuit includes an amplifier and an open-loop control system. The amplifier has an output stage for amplifying a signal, a power supply for driving a supply voltage of the output stage to different voltage levels responsive to being modulated and a pulse width modulator for modulating the power supply responsive to a mask input. The open-loop control system includes a mask generator and a detector. The mask generator is configured to generate the mask input as a function of the envelope of the signal. The detector is configured to detect discontinuities in the mask input and compensate for the discontinuities.

Those skilled in the art will recognize additional features and advantages upon reading the following detailed description, and upon viewing the accompanying drawings.

DETAILED DESCRIPTION

Figure 1:
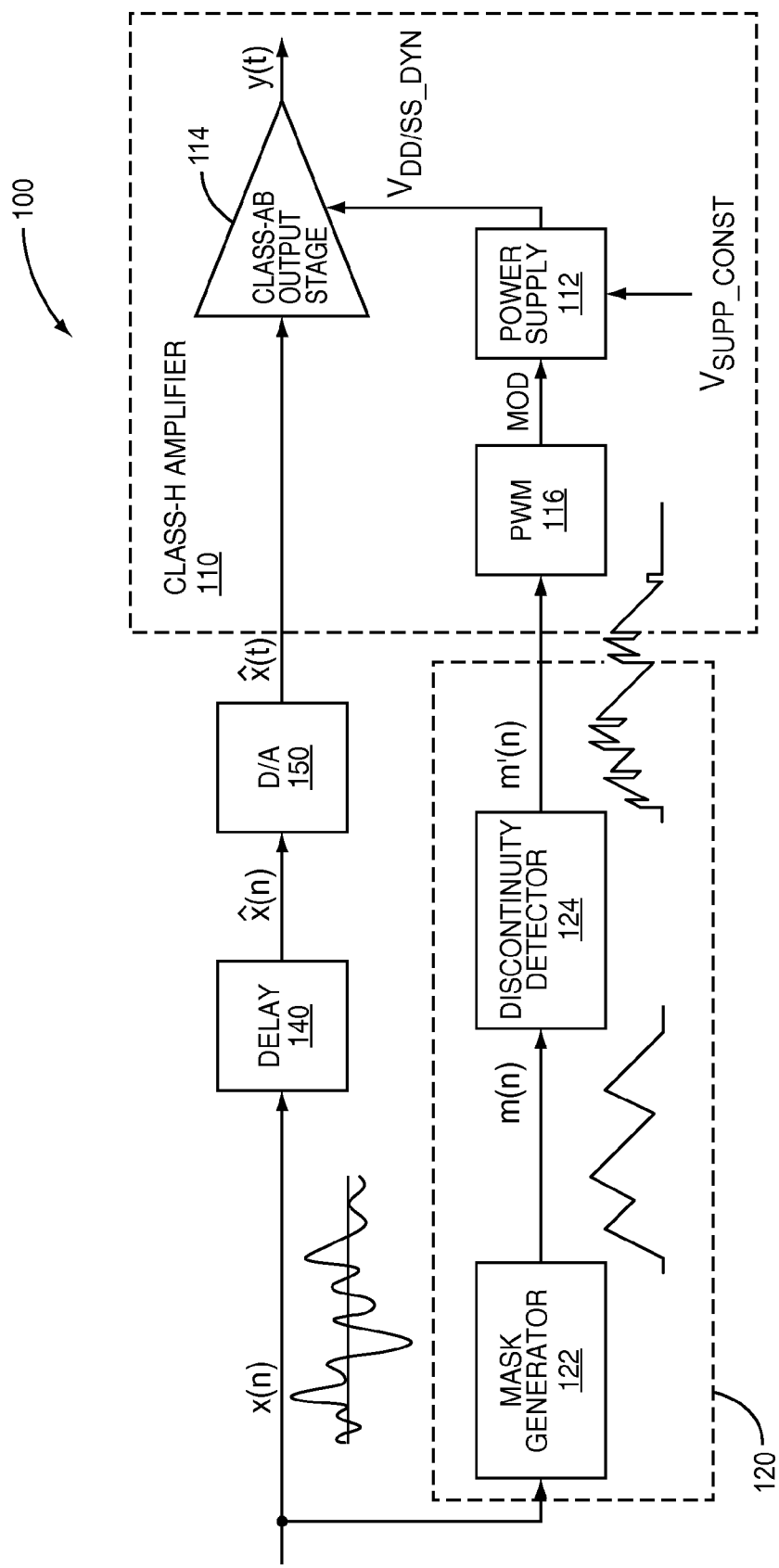
FIG. 1 illustrates a block diagram of an embodiment of an amplifier and corresponding open-loop control system.

FIG. 1 illustrates an embodiment of a transmitter circuit 100 including an amplifier 110 and an open-loop control system 120. The amplifier 110 includes a power supply 112, an output stage 114 and a pulse width modulator (PWM) 116. The transmitter circuit 100 is well-suited for high PAR applications such as DSL. In one embodiment, the amplifier 110 is a class-H amplifier and the power supply 112 is a buck-boost DC-DC voltage converter. The power supply 112 provides the supply voltage ($V_{DD/SS\_DYN}$) for the output stage 114 of the amplifier 110. In one embodiment, the output stage 114 is a class-AB output stage. The supply voltage output by the power supply 112 is modulated so that the supply voltage applied to the output stage 114 depends on or corresponds to the envelope of a signal of interest x(n). This way, energy consumption can be significantly reduced without clipping or otherwise distorting the signal during amplification. The open-loop control system 120 controls operation of the power supply 112 as a function of the envelope of the signal of interest without having to observe the power supply output voltage, reducing the overall complexity of the transmitter circuit 100. Because the control system 120 is open-loop, it is operated in a well-defined and predictable manner to ensure that the amplifier 110 is adequately powered during normal operation.

To that end, the power supply 112 preferably operates exclusively in the continuous mode where a current flows through a coil inductor of the power supply 112 during the entire switching cycle. In addition, the supply voltage ($V_{SUPP\_CONST}$) provided to the power supply 112 is preferably kept generally constant. Also, the open-loop control system 120 includes a mask generator 122 and a discontinuity detector 124 for controlling operation of the power supply 112. In more detail, the PWM 116 of the amplifier 110 outputs a signal (MOD) that modulates the power supply 112 responsive to a mask input m'(n) to the PWM 116. The mask m(n) is generated by the mask generator 122 as a function of the envelope of the signal of interest x(n). As such, the mask m(n) has a profile that corresponds to the envelope of the signal of interest x(n). The discontinuity detector 124 identifies discontinuities in the mask m(n) and compensates for the discontinuities to form the PWM mask input m'(n).

The term 'discontinuity' as used herein means any type of transition in the mask m(n) that causes ringing or transient oscillations in the power supply output. Transient oscillations in the power supply output caused by discontinuities in the mask m(n) adversely affect operation of the output stage 114, particularly when the transient oscillations cause clipping or distortion of the amplified signal y(t). The mask can consist of at least three different regions: flat areas, rising edges and falling edges. Thus, at least six different types of discontinuities can occur in the mask m(n): flat→rising; rising→flat; flat→falling; falling→flat; rising→falling and falling→rising.

Figure 2:
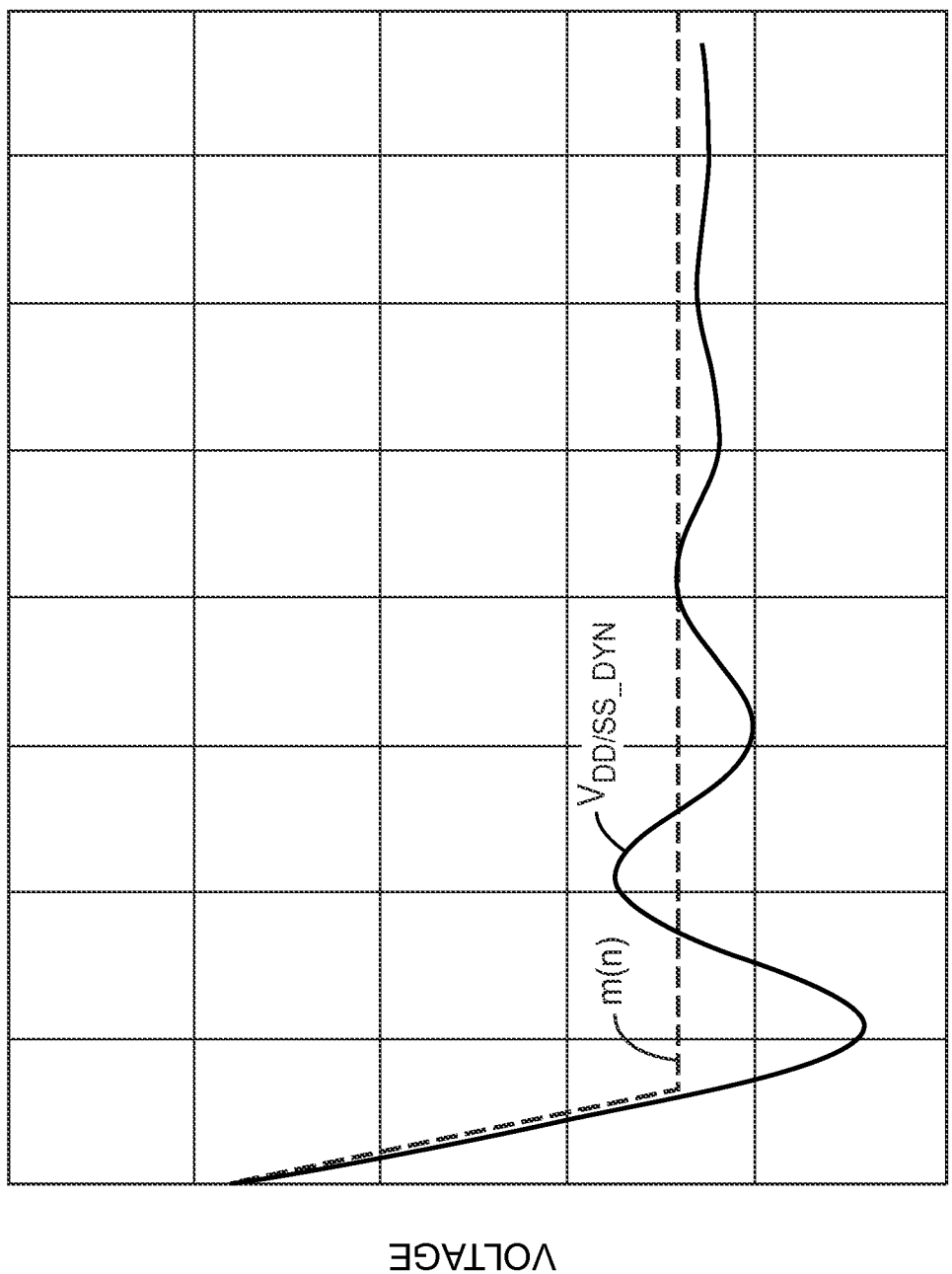
FIG. 2 illustrates a signal diagram showing a discontinuity in a mask input generated by the open-loop control system of FIG. 1.

FIG. 2 illustrates a discontinuity resulting from a falling-to-flat transition in the mask m(n) which causes a corresponding transient oscillation in the power supply output ($V_{DD/SS\_DYN}$). The falling transition in the mask m(n) corresponds to a decrease in the envelope of the signal of interest x(n). The resulting transient oscillation in the power supply output can cause clipping or distortion of the amplified signal y(t) depending on the magnitude and duration of the transient oscillation.

Figure 3:
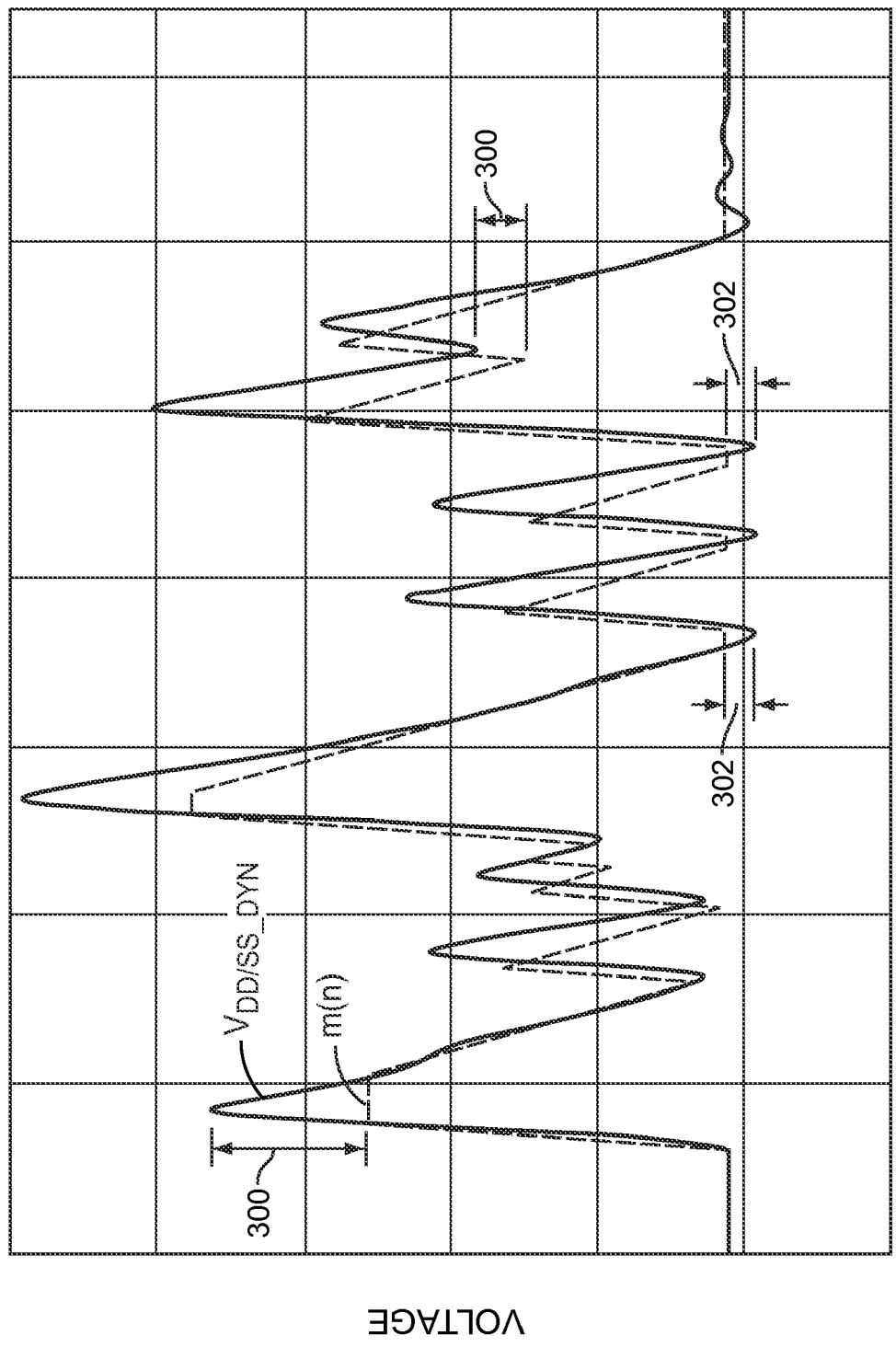
FIG. 3 illustrates a signal diagram showing the effect the mask discontinuity has on the supply voltage powering the amplifier of FIG. 1.

FIG. 3 illustrates an exemplary mask profile and the corresponding effect the mask m(n) has on the power supply output ($V_{DD/SS\_DYN}$) when the open-loop control system 120 is inactive. Discontinuities in the mask m(n) that are not compensated for cause problematic overshoot (300) and undershoot conditions (302) in the power supply output as shown in FIG. 3. Overshoots in the voltage supplied to the output stage 114 of the amplifier 110 waste energy and reduce efficiency. Undershoots also result in inefficiency and may cause clipping or distortion of the signal being amplified because the amplifier supply voltage may not be sufficiently high. The power supply output should generally track the mask profile with little or no overshoot and undershoot so that the amplifier 110 is optimally powered at all times.

Compensating for discontinuities in the mask m(n) enables the PWM 116 to reliably modulate the power supply 112 so that the voltage supplied to the output stage 114 of the amplifier 110 generally tracks the original mask m(n), ensuring reliable and efficient operation of the amplifier 110. The open-loop control system 120 does not detect and compensate for discontinuities in the mask m(n) based on a feedback signal from the amplifier output. Instead, the mask m(n) is compensated before being input to the PWM 116. In one embodiment, the discontinuity detector 124 filters the mask m(n) to compensate for discontinuities and the filtered mask m'(n) is then input to the PWM 116. In another embodiment, the detector 124 generates negative compensation pulses. According to this embodiment, the compensation pulses cause counteracting transient oscillations in the power supply output which cancel the transient oscillations caused by discontinuities in the mask m(n). The compensation pulses are superimposed on the mask m(n) to form a compensated mask m'(n) which is then input to the PWM 116 for modulating the power supply 112.

Figure 4:
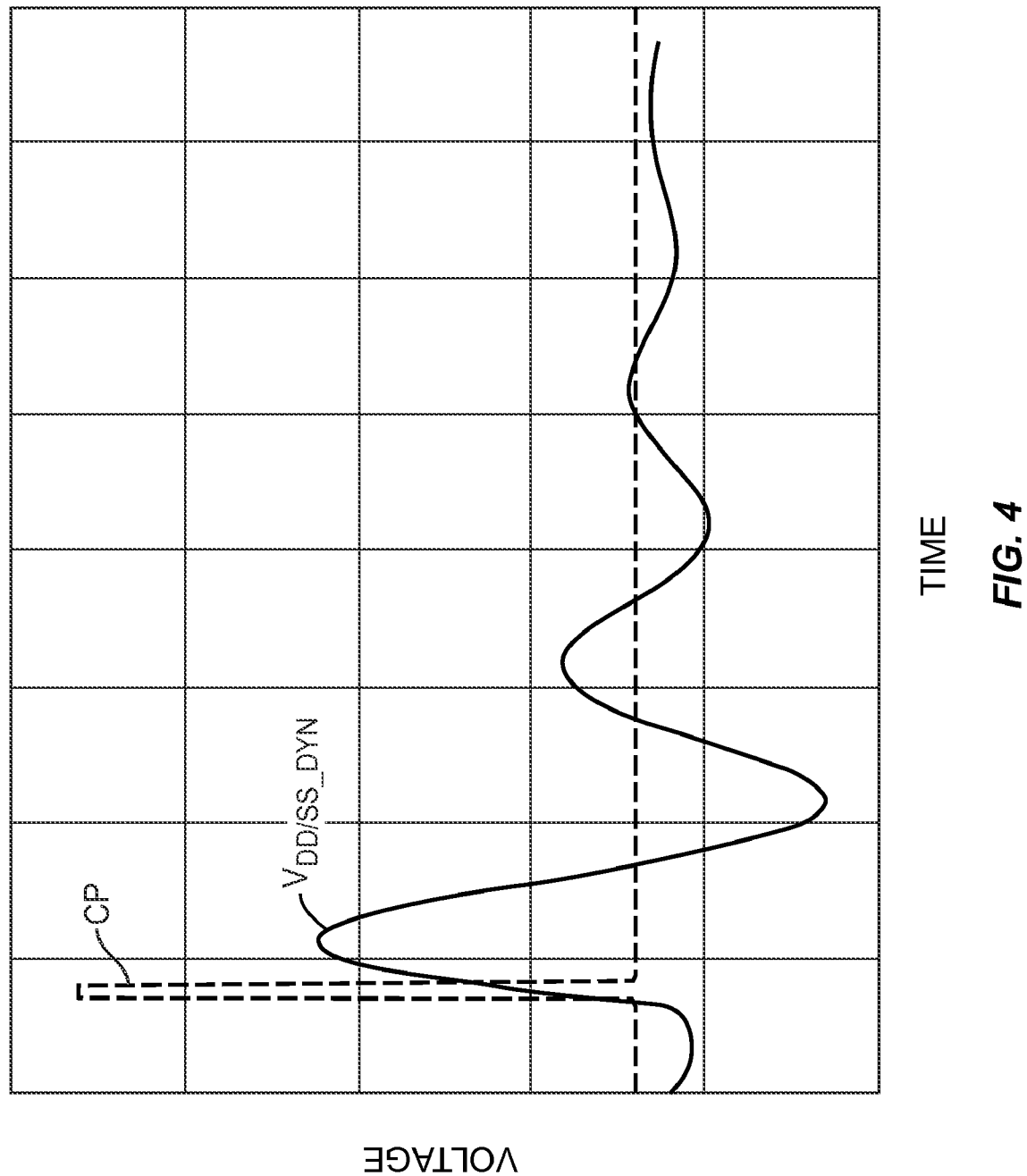
FIG. 4 illustrates a signal diagram showing a compensation pulse generated by the open-loop control system of FIG. 1 for counteracting the affect of the mask discontinuity.

FIG. 4 illustrates an embodiment of a compensation pulse (CP) generated in response to the falling-to-flat transition in the mask m(n) shown in FIG. 2. The compensation pulse causes a counteracting transient oscillation in the power supply output ($V_{DD/SS\_DYN}$) which cancels the transient oscillation caused by the discontinuity in the mask.

Figure 5:
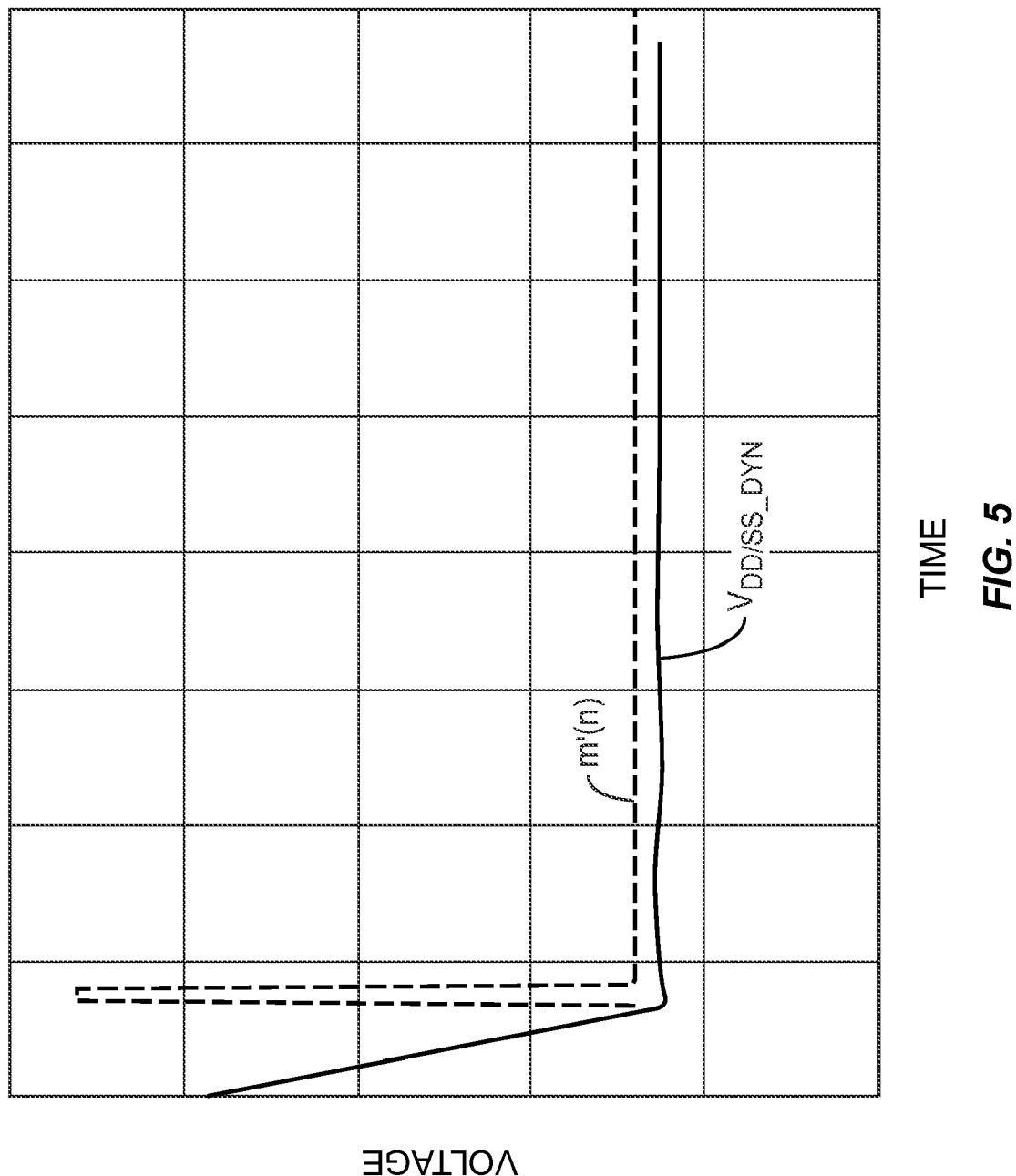
FIG. 5 illustrates a signal diagram showing the compensation pulse superimposed on the mask.

FIG. 5 shows the modified mask m'(n) after the compensation pulse shown in FIG. 4 is superimposed on the original mask m(n). The modified mask m'(n) is then input to the PWM 116, which in turns modulates the power supply 112. The transient oscillation in the power supply output caused by the discontinuity in the mask is effectively canceled by the counteracting transient oscillation caused by the compensation pulse. The result is that the amplifier 110 is reliably powered by the power supply 112 even when the envelope of the signal of interest x(n) fluctuates as shown in FIG. 6.

Figure 6:
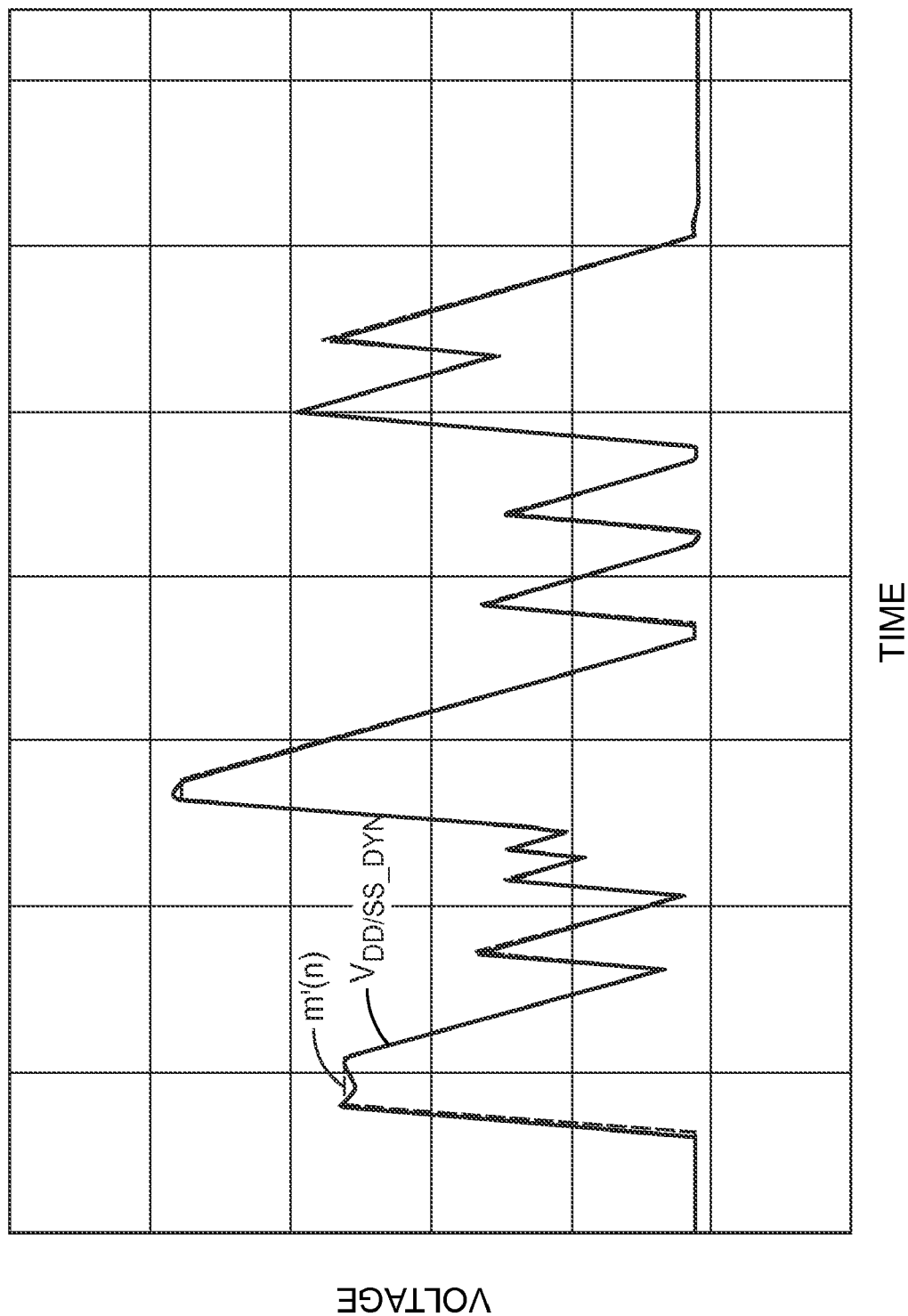
FIG. 6 illustrates a signal diagram showing the counteracting affect the compensation pulse has on the supply voltage powering the amplifier of FIG. 1.

FIG. 6 illustrates the exemplary mask profile shown in FIG. 3 after discontinuity compensation. As shown in FIG. 6, the power supply output ($V_{DD/SS\_DYN}$) has virtually no overshoots or undershoots when the open-loop control system 120 is active even though there are discontinuities in the original mask m(n). Instead, the supply voltage output by the power supply 112 closely tracks the modified mask m'(n) input to the PWM 116, enabling the amplifier 110 to efficiently amplify the signal of interest x(n) without clipping or otherwise distorting the signal. A delay element 140 is included in the transmitter circuit 100 for delaying the signal of interest x(n) so that the open-loop control system 120 has sufficient time to modulate the power supply 112 and the amplifier 110 has sufficient time to respond. A digital-to-analog converter (D/A) 150 converts the delayed signal x(n) to an analog signal x̂(t) which is then input to the output stage 114 of the amplifier 110 for amplification. Alternatively, the delay can be realized in the analog domain. In one embodiment, the position of the delay element 140 and the D/A converter 150 in the signal path is switched so that the delay element 140 receives the analog output of the D/A converter 150, thus delaying the signal of interest in the analog domain. Broadly, the signal of interest can be intentionally delayed at any desirable point in either the digital or analog domain. The amplified signal output ŷ(t) by the transmitter circuit 100 is driven onto a communication line such as a DSL line, e.g. via a hybrid circuit (not shown).

Figure 7:
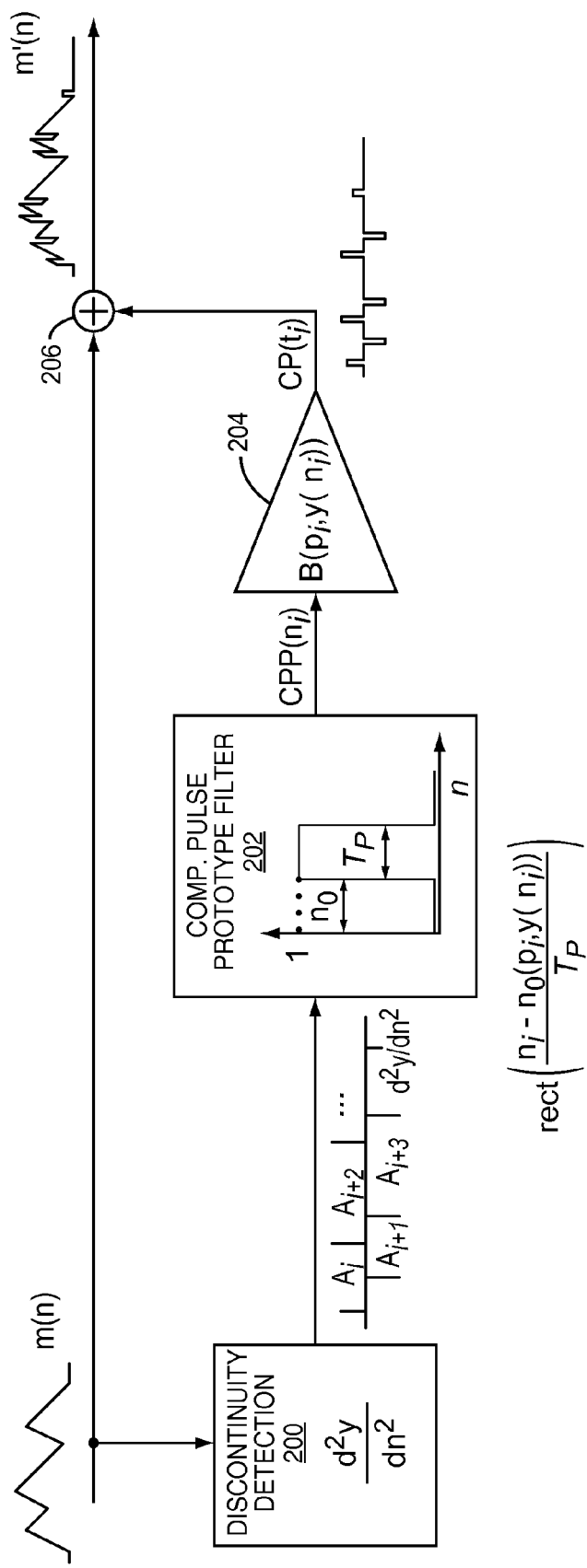
FIG. 7 illustrates a block diagram of an embodiment of a detector component of the open-loop control system of FIG. 1.

FIG. 7 illustrates an embodiment of the discontinuity detector 124 of the open-loop control system 120. According to this embodiment, the detector 124 detects discontinuities in the original mask m(n), generates corresponding compensation pulses CP($t_i$) which counteract transient oscillations in the power supply output ($V_{DD/SS\_DYN}$) caused by the discontinuities and superimposes the compensation pulses on the original mask m(n) to form a modified mask m'(n) that is input to the PWM 116. For the superposition principle to be optimally employed, the power supply 112 preferably operates linearly to a first approximation. Accordingly, the gradient of the rising and falling edges of the mask m(n) is selected by the mask generator 122 to be smaller than the technological circuit maximum. As a result, nonlinear elements in the system behavior are reduced, and moreover, dependencies on component tolerances can be largely ignored.

In more detail, the discontinuity detector 124 includes discontinuity detection logic 200 for detecting discontinuities in the mask m(n). In an embodiment, the discontinuity detection logic 200 takes the second derivative of the mask m(n) with respect to time to detect discontinuities in the mask. The output of the detection logic 200 is a series of Dirac pulses individually scaled by a scaling factor A($p_i$) based on the assumption that the amplitude of the oscillation generated by the discontinuity p at time i is directly proportional to the change in the gradient at the discontinuity point as given by:

$$A(p_i) = -\frac{d^2 y}{dt^2}\bigg|_{t=t_i} \quad (4)$$

The negative sign in equation (4) ensures that the transient oscillation in the power supply output ($V_{DD/SS\_DYN}$) caused by the compensation pulse CP($t_i$) counteracts the transient oscillation caused by the discontinuity $p_i$ in the mask m(n).

A folding (e.g. convolution) operation is then performed on the scaling factor A($p_i$) by a compensation pulse prototype filter 202. In an embodiment, a rectangular signal function rect() is input to the filter 202 which outputs rectangular compensation pulse prototypes having a fixed width (Tp) based on rising and falling transitions in the mask m(n) as given by:

$$CPP(p_i) = rect\left(\frac{n_i - n_0(p_i, y(n_i))}{T_p}\right) \quad (5)$$

where n represents the sample index, i the discontinuity index, $p_i$ the discontinuity type (e.g., flat→rising, rising→flat, etc.), no is the delay from the discontinuity to the start of the pulse and Tp is the pulse width.

The output of the compensation pulse prototype filter 202 is input to a scaling block 204 that scales the amplitude of the filter output by a base scaling factor B. In one embodiment, the base scaling factor B is a function of the pulse type $p_i$. Furthermore, the base scaling factor B can be a function of the present voltage level at the discontinuity point. In another embodiment, the base scaling factor B applied to each compensation pulse is a constant factor determined empirically. In each embodiment, the scaling block 204 outputs the compensation pulses CP($t_i$). A signal combiner 206 superimposes the compensation pulses on the original mask m(n) to form the modified mask m'(n) which is input to the PWM 116.

Compensation pulse CP($t_i$) is generated for the $i^{th}$ discontinuity of type $p_i$ at the instant $t_i$ as given by:

$$CP(t_i) = B \cdot A(p_i) \cdot rect\left(\frac{t_i - t_0}{T_p}\right) \quad (6)$$

As such, each compensation pulse CP($t_i$) generated by the discontinuity detector 124 is a scaled and temporally shifted generally rectangular signal having an amplitude corresponding to the gradient of a rising/falling transition in the original mask m(n). The temporal duration Tp of the compensation pulses CP($t_i$) is preferably freely selectable within a certain framework, where a change in Tp yields a corresponding change in the base scaling factor B. The duration of each compensation pulse $CP(t_i)$ is preferably very short. In one embodiment, the duration of the compensation pulses $CP(t_i)$ is a multiple of the PWM period Ts.

The compensation effect provided by the open-loop control system 120 can be improved by positioning the compensation pulses $CP(t_i)$ with a certain temporal delay to with respect to each discontinuity point in the mask m(n). In one embodiment, each compensation pulse $CP(t_i)$ is delayed approximately 0.5 μs to 1 μs with respect to the corresponding discontinuity. In addition, the base scaling factor B and the temporal offset to employed by the open-loop control system 120 can be a function of discontinuity type $p_i$. Alternatively, a uniform base scaling factor B and uniform temporal offset $t_0$ can be used regardless of discontinuity type.

Figure 8:
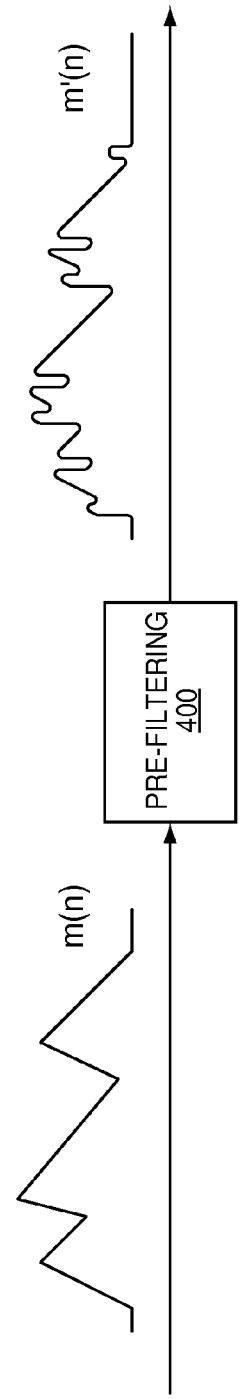
FIG. 8 illustrates a block diagram of another embodiment of the detector component of the open-loop control system of FIG. 1.

FIG. 8 illustrates another embodiment of the discontinuity detector 124 of the open-loop control system 120. According to this embodiment, the detector 124 is a pre-filtering block 400 for filtering the mask m(n) to compensate for discontinuities. The detector 124 can be implemented as a single pre-filtering block or a plurality of sub-filters. In either case, the filtered mask m'(n) output is then input to the PWM 132.

The term 'circuit' as used herein can include a single chip, multiple chips or a combination of one or more chips and software. As such, the amplifier 110 and the open-loop control system 120 can be fabricated on the same chip or different chips. For example, the amplifier 110 can be included in a line driver chip. The open-loop control system 120 and the D/A converter 150 can be included in a digital front-end (DFE) chip and/or an analog front-end (AFE) chip. The delay element 140, if implemented as an analog block, can be part of the line driver chip. Otherwise, the delay element 140 can be included in the DFE chip or the AFE chip. Similarly, the mask generator 122 and the discontinuity detector 124 can be included in the line driver chip, the DFE chip or the AFE chip. The DFE and AFE chips can be combined in a single package, or the AFE chip and the line driver chip can be combined in a single package. Alternatively, the DFE, AFE and line driver can be included in a single chip.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A circuit, comprising:
   an amplifier having an output stage configured to amplify a signal, a power supply configured to drive a supply voltage of the output stage to different voltage levels responsive to being modulated and a pulse width modulator configured to modulate the power supply responsive to a mask input;
   an open-loop control system comprising a mask generator and a detector; and
   wherein the mask generator is configured to generate the mask input as a function of the envelope of the signal and the detector is configured to detect discontinuities in the mask input and compensate for the discontinuities by generating compensation pulses which offset the discontinuities and superimposing the compensation pulses on the mask input.

2. The circuit of claim 1, wherein the detector is configured to detect changes in transitions of the mask input and generate the compensation pulses as a function of the detected changes.

3. The circuit of claim 1, wherein the detector is configured to generate generally rectangular compensation pulses having a fixed width and variable amplitude based on changes detected in transitions of the mask input.

4. The circuit of claim 3, wherein the pulse width modulator has a predetermined sampling period and the fixed width of the generally rectangular compensation pulses is a multiple of the predetermined sampling period.

5. The circuit of claim 3, wherein the variable amplitude of the generally rectangular compensation pulses is a function of the second derivative of the mask input.

6. The circuit of claim 1, wherein the detector is configured to delay each compensation pulse with respect to the corresponding discontinuity by a predetermined duration of time.

7. The circuit of claim 6, wherein the predetermined duration of time is approximately 0.5 μs to 1 μs.

8. The circuit of claim 1, wherein the amplifier comprises a class-H amplifier and the power supply comprises a buck-boost voltage converter.

9. The circuit of claim 1, comprising a delay element configured to delay the signal so that the open-loop control system has sufficient time for modulating the power supply and the output stage has sufficient time for responding to the modulation before the signal is amplified.

10. A method of amplifying a signal by a circuit having an amplifier powered by a supply voltage generated by a power supply and an open-loop control system for controlling operation of the power supply, the method comprising:
    modulating the power supply responsive to a mask input to a pulse width modulator;
    driving the supply voltage to different voltage levels responsive to the power supply being modulated;
    generating the mask as a function of the envelope of the signal;
    detecting discontinuities in the mask; and
    compensating for the discontinuities by generating compensation pulses which offset the discontinuities and superimposing the compensation pulses on the mask so that the supply voltage generally tracks the mask.

11. The method of claim 10, wherein detecting the discontinuities comprises detecting changes in transitions of the mask input and wherein the compensation pulses are generated as a function of the detected changes.

12. The method of claim 10, wherein generating the compensation pulses comprises generating generally rectangular compensation pulses having a fixed width and variable amplitude based on changes detected in transitions of the mask.

13. The method of claim 12, wherein the pulse width modulator has a predetermined sampling period and the fixed width of the generally rectangular compensation pulses is a multiple of the predetermined sampling period.

14. The method of claim 12, wherein the variable amplitude of the generally rectangular compensation pulses is a function of the second derivative of the mask.

15. The method of claim 10, comprising delaying each compensation pulse with respect to the corresponding discontinuity by a predetermined duration of time.

16. The method of claim 15, wherein the predetermined duration of time is approximately 0.5 µs to 1 µs.

17. The method of claim 10, comprising delaying the signal so that the pulse width modulator has sufficient time for modulating the power supply and the amplifier has sufficient time for responding to the modulation before the signal is amplified.

18. A circuit, comprising:
    an amplifier having an output stage configured to amplify a signal and a power supply configured to drive a supply voltage of the output stage to different voltage levels responsive to being modulated;
    an open-loop control system configured to modulate the power supply as a function of the envelope of the signal so that transient oscillations in the supply voltage arising responsive to the power supply being modulated are offset by compensation pulses which cause counteracting transient oscillations in the supply voltage; and
    a delay element configured to delay the signal so that the open-loop control system has sufficient time for modulating the power supply and the amplifier has sufficient time for responding to the modulation before the signal is amplified.

19. The circuit of claim 18, wherein the open-loop control system is configured to delay each compensation pulse with respect to the corresponding transient oscillation by a predetermined duration of time.

20. The circuit of claim 18, wherein the predetermined duration of time is approximately 0.5 µs to 1 µs.

21. The circuit of claim 18, wherein the amplifier comprises a class-H amplifier and the power supply comprises a buck-boost voltage converter.

22. A method of amplifying a signal, comprising:
    inputting the signal to an amplifier powered by a supply voltage generated by a power supply;
    driving the supply voltage to different voltage levels responsive to the power supply being modulated;
    modulating the power supply as a function of the envelope of the signal so that transient oscillations in the supply voltage arising responsive to the power supply being modulated are offset by compensation pulses which cause counteracting transient oscillations in the supply voltage; and
    delaying the signal so that the power supply has sufficient time for being modulated and the amplifier has sufficient time for responding to the modulation before the signal is amplified.

23. The method of claim 22, comprising delaying each compensation pulse with respect to the corresponding transient oscillation by a predetermined duration of time.

24. The method of claim 22, wherein the predetermined duration of time is approximately 0.5 µs to 1 µs.

* * * * *